(12) United States Patent
Su et al.

(10) Patent No.: US 9,564,346 B2
(45) Date of Patent: Feb. 7, 2017

(54) PACKAGE CARRIER, SEMICONDUCTOR PACKAGE, AND PROCESS FOR FABRICATING SAME

(71) Applicant: Advanced Semiconductor Engineering, Inc., Kaohsiung (TW)

(72) Inventors: Yuan-Chang Su, Luzhu Township (TW); Shih-Fu Huang, Zhudong Township (TW); Chia-Cheng Chen, Zhongli (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/088,683

(22) Filed: Apr. 1, 2016

(65) Prior Publication Data

US 2016/0218019 A1    Jul. 28, 2016

Related U.S. Application Data

(63) Continuation of application No. 12/904,876, filed on Oct. 14, 2010, now abandoned.

(Continued)

(30) Foreign Application Priority Data

Apr. 20, 2010  (TW) .............................. 99112317 A

(51) Int. Cl.
*H01L 21/48* (2006.01)
*H01L 21/683* (2006.01)
(Continued)

(52) U.S. Cl.
CPC ......... *H01L 21/486* (2013.01); *H01L 21/6835* (2013.01); *H01L 23/3128* (2013.01);
(Continued)

(58) Field of Classification Search
CPC .............. H01L 21/486; H01L 21/6835; H01L 2221/68345; H01L 2221/68359; H01L 2224/32188; H01L 23/49827
See application file for complete search history.

(56) References Cited

U.S. PATENT DOCUMENTS 3,959,874 A    6/1976   Coucoulas
4,783,695 A    11/1988  Eichelberger et al.
(Continued)

OTHER PUBLICATIONS

Appelt et al., "Coreless substrates status." Proc. EPTC 2010 (12th Electronics Packaging Tech. Conf, Singapore (2010).
(Continued)

*Primary Examiner* — Raj R Gupta
(74) *Attorney, Agent, or Firm* — Foley & Lardner LLP; Cliff Z. Liu

(57) ABSTRACT

A package carrier includes: (1) a dielectric layer; (2) a first electrically conductive pattern, embedded in the dielectric layer and disposed adjacent to a first surface of the dielectric layer, and including a plurality of first pads; (3) a plurality of first electrically conductive posts, extending through the dielectric layer, wherein each of the first electrically conductive posts includes a first electrically conductive post segment connected to at least one of the first pads and a second electrically conductive post segment connected to the first electrically conductive post segment, and a lateral extent of the first electrically conductive post segment is different from a lateral extent of the second electrically conductive post segment; and (4) a second electrically conductive pattern, disposed adjacent to a second surface of the dielectric layer, and including a plurality of second pads connected to respective ones of the second electrically conductive post segments.

20 Claims, 14 Drawing Sheets

Related U.S. Application Data

(60) Provisional application No. 61/251,396, filed on Oct. 14, 2009, provisional application No. 61/294,519, filed on Jan. 13, 2010.

(51) Int. Cl.
*H01L 23/31* (2006.01)
*H01L 23/498* (2006.01)
*H01L 23/00* (2006.01)

(52) U.S. Cl.
CPC .. *H01L 23/49816* (2013.01); *H01L 23/49827* (2013.01); *H01L 24/48* (2013.01); *H01L 24/83* (2013.01); *H01L 24/85* (2013.01); *H01L 24/92* (2013.01); *H01L 24/73* (2013.01); *H01L 2221/68345* (2013.01); *H01L 2221/68359* (2013.01); *H01L 2224/27013* (2013.01); *H01L 2224/32188* (2013.01); *H01L 2224/32225* (2013.01); *H01L 2224/484* (2013.01); *H01L 2224/48091* (2013.01); *H01L 2224/48106* (2013.01); *H01L 2224/48227* (2013.01); *H01L 2224/48228* (2013.01); *H01L 2224/73265* (2013.01); *H01L 2224/92247* (2013.01); *H01L 2924/00014* (2013.01); *H01L 2924/014* (2013.01); *H01L 2924/0105* (2013.01); *H01L 2924/01028* (2013.01); *H01L 2924/01029* (2013.01); *H01L 2924/01033* (2013.01); *H01L 2924/01046* (2013.01); *H01L 2924/01047* (2013.01); *H01L 2924/01075* (2013.01); *H01L 2924/01078* (2013.01); *H01L 2924/01079* (2013.01); *H01L 2924/01082* (2013.01); *H01L 2924/06* (2013.01); *H01L 2924/0665* (2013.01); *H01L 2924/07025* (2013.01); *H01L 2924/15311* (2013.01); *H01L 2924/181* (2013.01)

(56) References Cited

U.S. PATENT DOCUMENTS

| | | |
|---|---|---|
| 5,019,535 A | 5/1991 | Wojnarowski et al. |
| 5,091,769 A | 2/1992 | Eichelberger |
| 5,111,278 A | 5/1992 | Eichelberger |
| 5,120,678 A | 6/1992 | Moore et al. |
| 5,149,662 A | 9/1992 | Eichelberger |
| 5,151,776 A | 9/1992 | Wojnarowski et al. |
| 5,157,589 A | 10/1992 | Cole et al. |
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |
| 5,353,195 A | 10/1994 | Fillion et al. |
| 5,353,498 A | 10/1994 | Fillion et al. |
| 5,422,513 A | 6/1995 | Marcinkiewicz et al. |
| 5,519,936 A | 5/1996 | Andros et al. |
| 5,527,741 A | 6/1996 | Cole et al. |
| 5,546,654 A | 8/1996 | Wojnarowski et al. |
| 5,554,887 A | 9/1996 | Sawai et al. |
| 5,567,656 A | 10/1996 | Chun |
| 5,583,376 A | 12/1996 | Sickler et al. |
| 5,592,025 A | 1/1997 | Clark et al. |
| 5,703,400 A | 12/1997 | Wojnarowski et al. |
| 5,710,062 A | 1/1998 | Sawai et al. |
| 5,745,984 A | 5/1998 | Cole et al. |
| 5,834,340 A | 11/1998 | Sawai et al. |
| 5,841,193 A | 11/1998 | Eichelberger |
| 5,866,952 A | 2/1999 | Wojnarowski et al. |
| 5,874,784 A | 2/1999 | Aoki et al. |
| 5,994,773 A | 11/1999 | Hirakawa |
| 6,028,358 A | 2/2000 | Suzuki |
| 6,046,071 A | 4/2000 | Sawai et al. |
| 6,060,775 A | 5/2000 | Ano |
| 6,080,932 A | 6/2000 | Smith et al. |
| 6,087,717 A | 7/2000 | Ano et al. |
| 6,159,767 A | 12/2000 | Eichelberger |
| 6,177,636 B1 | 1/2001 | Fjelstad |
| 6,198,165 B1 | 3/2001 | Yamaji et al. |
| 6,232,151 B1 | 5/2001 | Ozmat et al. |
| 6,232,661 B1 | 5/2001 | Amagai et al. |
| 6,239,482 B1 | 5/2001 | Fillion et al. |
| 6,242,815 B1 | 6/2001 | Hsu et al. |
| 6,265,765 B1 | 7/2001 | DiStefano et al. |
| 6,271,057 B1 | 8/2001 | Lee et al. |
| 6,294,741 B1 | 9/2001 | Cole et al. |
| 6,306,680 B1 | 10/2001 | Fillion et al. |
| 6,331,451 B1 | 12/2001 | Fusaro et al. |
| 6,358,780 B1 | 3/2002 | Smith et al. |
| 6,377,461 B1 | 4/2002 | Ozmat et al. |
| 6,396,148 B1 | 5/2002 | Eichelberger et al. |
| 6,426,545 B1 | 7/2002 | Eichelberger et al. |
| 6,428,942 B1 | 8/2002 | Jiang et al. |
| 6,486,006 B2 | 11/2002 | Hirano et al. |
| 6,504,111 B2 * | 1/2003 | Curcio ............... H05K 3/423 174/264 |
| 6,552,430 B1 | 4/2003 | Perez et al. |
| 6,555,908 B1 | 4/2003 | Eichelberger et al. |
| 6,580,159 B1 | 6/2003 | Fusaro et al. |
| 6,586,822 B1 | 7/2003 | Vu et al. |
| 6,630,630 B1 | 10/2003 | Maezawa et al. |
| 6,663,946 B2 | 12/2003 | Seri et al. |
| 6,680,529 B2 | 1/2004 | Chen et al. |
| 6,701,614 B2 | 3/2004 | Ding et al. |
| 6,768,061 B2 | 7/2004 | Kondo |
| 6,774,317 B2 | 8/2004 | Fjelstad |
| 6,818,544 B2 | 11/2004 | Eichelberger et al. |
| 6,838,776 B2 | 1/2005 | Leal et al. |
| 6,845,554 B2 | 1/2005 | Frankowsky et al. |
| 6,861,757 B2 | 3/2005 | Shimoto et al. |
| 6,889,433 B1 * | 5/2005 | Enomoto ............. H05K 3/4069 29/825 |
| 6,921,683 B2 | 7/2005 | Nakayama |
| 6,921,975 B2 | 7/2005 | Leal et al. |
| 6,953,708 B2 | 10/2005 | Hedler et al. |
| 6,969,916 B2 | 11/2005 | Shizuno |
| 6,977,348 B2 | 12/2005 | Ho et al. |
| 7,015,075 B2 | 3/2006 | Fay et al. |
| 7,045,908 B2 | 5/2006 | Ohsumi |
| 7,048,450 B2 | 5/2006 | Beer et al. |
| 7,087,991 B2 | 8/2006 | Chen et al. |
| 7,091,595 B2 | 8/2006 | Fuergut et al. |
| 7,112,467 B2 | 9/2006 | Eichelberger et al. |
| 7,141,884 B2 | 11/2006 | Kojima et al. |
| 7,145,228 B2 | 12/2006 | Yean et al. |
| 7,163,843 B2 | 1/2007 | Kiendl et al. |
| 7,173,330 B2 | 2/2007 | Eng et al. |
| 7,294,791 B2 | 11/2007 | Danoski et al. |
| 7,319,049 B2 * | 1/2008 | Oi ............... H01L 21/4857 257/686 |
| 7,338,884 B2 | 3/2008 | Shimoto et al. |
| 7,344,917 B2 | 3/2008 | Gautham |
| 7,361,533 B1 | 4/2008 | Huemoeller et al. |
| 7,361,987 B2 | 4/2008 | Leal et al. |
| 7,364,944 B2 | 4/2008 | Huang et al. |
| 7,371,617 B2 | 5/2008 | Tsai et al. |
| 7,405,486 B2 | 7/2008 | Kato |
| 7,423,340 B2 | 9/2008 | Huang et al. |
| 7,425,464 B2 | 9/2008 | Fay et al. |
| 7,453,148 B2 | 11/2008 | Yang et al. |
| 7,476,563 B2 | 1/2009 | Mangrum et al. |
| 7,482,198 B2 | 1/2009 | Bauer et al. |
| 7,501,310 B2 | 3/2009 | Yang et al. |
| 7,511,365 B2 | 3/2009 | Wu et al. |
| 7,514,767 B2 | 4/2009 | Yang |
| 7,575,173 B2 | 8/2009 | Fuergut et al. |
| 7,588,951 B2 | 9/2009 | Mangrum et al. |
| 7,595,226 B2 | 9/2009 | Lytle et al. |
| 7,595,553 B2 | 9/2009 | Nagamatsu et al. |
| 7,598,616 B2 | 10/2009 | Yang et al. |
| 7,612,295 B2 | 11/2009 | Takada et al. |
| 7,619,304 B2 | 11/2009 | Bauer et al. |

(56) References Cited

U.S. PATENT DOCUMENTS

| | | |
|---|---|---|
| 7,619,901 B2 | 11/2009 | Eichelberger et al. |
| 7,622,733 B2 | 11/2009 | Fuergut et al. |
| 7,635,641 B2 | 12/2009 | Hurwitz et al. |
| 7,655,501 B2 | 2/2010 | Yang et al. |
| 7,662,667 B2 | 2/2010 | Shen |
| 7,667,318 B2 | 2/2010 | Yang et al. |
| 7,675,157 B2 | 3/2010 | Liu et al. |
| 7,682,972 B2 | 3/2010 | Hurwitz et al. |
| 7,692,286 B1 | 4/2010 | Huemoeller et al. |
| 7,714,431 B1 | 5/2010 | Huemoeller et al. |
| 7,727,803 B2 | 6/2010 | Yamagata |
| 7,732,242 B2 | 6/2010 | Brunnbauer et al. |
| 7,741,151 B2 | 6/2010 | Amrine et al. |
| 7,759,163 B2 | 7/2010 | Kroeninger et al. |
| 7,763,976 B2 | 7/2010 | Tang et al. |
| 7,767,495 B2 | 8/2010 | Fuergut et al. |
| 7,799,602 B2 | 9/2010 | Pagaila et al. |
| 7,807,512 B2 | 10/2010 | Lee et al. |
| 7,812,434 B2 | 10/2010 | Yang |
| 7,830,004 B2 | 11/2010 | Wu |
| 7,834,464 B2 | 11/2010 | Meyer et al. |
| 7,842,541 B1 | 11/2010 | Rusli et al. |
| 7,932,599 B2 | 4/2011 | Kiendl et al. |
| 8,017,515 B2 | 9/2011 | Marimuthu et al. |
| 8,035,213 B2 | 10/2011 | Lee et al. |
| 8,039,303 B2 | 10/2011 | Shim et al. |
| 8,110,916 B2 | 2/2012 | Weng et al. |
| 8,278,746 B2 | 10/2012 | Ding et al. |
| 8,288,869 B2 | 10/2012 | Huang et al. |
| 8,320,134 B2 | 11/2012 | Su et al. |
| 8,330,267 B2 | 12/2012 | Chen et al. |
| 8,334,594 B2 | 12/2012 | Lo et al. |
| 8,358,001 B2 | 1/2013 | Yang et al. |
| 8,367,473 B2 | 2/2013 | Huang et al. |
| 8,372,689 B2 | 2/2013 | Lee et al. |
| 8,378,466 B2 | 2/2013 | Chiu et al. |
| 8,399,776 B2 | 3/2013 | Appelt et al. |
| 8,405,213 B2 | 3/2013 | Chen et al. |
| 8,569,894 B2 | 10/2013 | Su et al. |
| 8,884,424 B2 | 11/2014 | Su et al. |
| 2002/0030266 A1 | 3/2002 | Murata |
| 2002/0056192 A1 | 5/2002 | Suwa et al. |
| 2002/0153618 A1 | 10/2002 | Hirano et al. |
| 2002/0171145 A1 | 11/2002 | Higuchi et al. |
| 2002/0173069 A1 | 11/2002 | Shibata |
| 2002/0182776 A1 | 12/2002 | Fujisawa et al. |
| 2002/0192872 A1 | 12/2002 | Fujisawa et al. |
| 2003/0030137 A1 | 2/2003 | Hashimoto |
| 2003/0034553 A1 | 2/2003 | Ano |
| 2003/0090883 A1 | 5/2003 | Asahi et al. |
| 2003/0098502 A1 | 5/2003 | Sota |
| 2003/0213990 A1 | 11/2003 | Tsai et al. |
| 2004/0012099 A1 | 1/2004 | Nakayama |
| 2004/0080054 A1 | 4/2004 | Chinda et al. |
| 2004/0110319 A1 | 6/2004 | Fukutomi et al. |
| 2004/0178500 A1 | 9/2004 | Usui |
| 2004/0201101 A1 | 10/2004 | Kang et al. |
| 2005/0006752 A1 | 1/2005 | Ogawa |
| 2005/0186704 A1 | 8/2005 | Yee et al. |
| 2005/0253244 A1 | 11/2005 | Chang |
| 2006/0065387 A1 | 3/2006 | Tonapi et al. |
| 2006/0071315 A1 | 4/2006 | Oh et al. |
| 2006/0231944 A1 | 10/2006 | Huang et al. |
| 2007/0052076 A1 | 3/2007 | Ramos et al. |
| 2007/0057364 A1 | 3/2007 | Wang et al. |
| 2007/0096311 A1 | 5/2007 | Humpston et al. |
| 2007/0176281 A1 | 8/2007 | Kim et al. |
| 2007/0190690 A1 | 8/2007 | Chow et al. |
| 2007/0222054 A1 | 9/2007 | Hembree |
| 2007/0234563 A1 | 10/2007 | Sakaguchi et al. |
| 2007/0272940 A1 | 11/2007 | Lee et al. |
| 2008/0081161 A1 | 4/2008 | Tomita et al. |
| 2008/0089048 A1 | 4/2008 | Yamano et al. |
| 2008/0136033 A1 | 6/2008 | Nagamatsu et al. |
| 2008/0136041 A1 | 6/2008 | Kotake et al. |
| 2008/0137314 A1 | 6/2008 | Salama et al. |
| 2008/0284017 A1 | 11/2008 | Lee et al. |
| 2008/0316714 A1 | 12/2008 | Eichelberger et al. |
| 2009/0045512 A1 | 2/2009 | Hedler et al. |
| 2009/0047797 A1 | 2/2009 | Anderson et al. |
| 2009/0075428 A1 | 3/2009 | Tang et al. |
| 2009/0101400 A1 | 4/2009 | Yamakoshi |
| 2009/0102066 A1 | 4/2009 | Lee et al. |
| 2009/0115072 A1 | 5/2009 | Rhyner et al. |
| 2009/0127686 A1 | 5/2009 | Yang et al. |
| 2009/0129037 A1 | 5/2009 | Yoshino |
| 2009/0224391 A1 | 9/2009 | Lin et al. |
| 2009/0236686 A1 | 9/2009 | Shim et al. |
| 2009/0261466 A1 | 10/2009 | Pagaila et al. |
| 2009/0294160 A1 | 12/2009 | Yoshimura et al. |
| 2010/0006330 A1 | 1/2010 | Fu et al. |
| 2010/0006994 A1 | 1/2010 | Shim et al. |
| 2010/0072599 A1 | 3/2010 | Camacho et al. |
| 2010/0072618 A1 | 3/2010 | Camacho et al. |
| 2010/0084759 A1 | 4/2010 | Shen |
| 2010/0096739 A1 | 4/2010 | Kawabata et al. |
| 2010/0109132 A1 | 5/2010 | Ko et al. |
| 2010/0214780 A1 | 8/2010 | Villard |
| 2010/0224983 A1 | 9/2010 | Huang et al. |
| 2010/0244208 A1 | 9/2010 | Pagaila et al. |
| 2010/0288541 A1 | 11/2010 | Appelt et al. |
| 2010/0289132 A1 | 11/2010 | Huang et al. |
| 2010/0308449 A1 | 12/2010 | Yang et al. |
| 2010/0314744 A1 | 12/2010 | Huang et al. |
| 2010/0314746 A1 | 12/2010 | Hsieh et al. |
| 2010/0320585 A1 | 12/2010 | Jiang et al. |
| 2010/0320593 A1 | 12/2010 | Weng et al. |
| 2010/0320610 A1 | 12/2010 | Huang et al. |
| 2011/0018118 A1 | 1/2011 | Hsieh et al. |
| 2011/0018124 A1 | 1/2011 | Yang et al. |
| 2011/0037169 A1 | 2/2011 | Pagaila |
| 2011/0057301 A1 | 3/2011 | Chen et al. |
| 2011/0068453 A1 | 3/2011 | Cho et al. |
| 2011/0068459 A1 | 3/2011 | Pagaila et al. |
| 2011/0074008 A1 | 3/2011 | Hsieh |
| 2011/0084370 A1 | 4/2011 | Su et al. |
| 2011/0084372 A1 | 4/2011 | Su et al. |
| 2011/0115060 A1 | 5/2011 | Chiu et al. |
| 2011/0115082 A1 | 5/2011 | Gluschenkov et al. |
| 2011/0127654 A1 | 6/2011 | Weng et al. |
| 2011/0140364 A1 | 6/2011 | Head |
| 2011/0169150 A1 | 7/2011 | Su et al. |
| 2011/0177654 A1 | 7/2011 | Lee et al. |
| 2011/0194265 A1 | 8/2011 | Su et al. |
| 2011/0227219 A1 | 9/2011 | Alvarado et al. |
| 2011/0227220 A1 | 9/2011 | Chen et al. |
| 2011/0241192 A1 | 10/2011 | Ding et al. |
| 2011/0241193 A1 | 10/2011 | Ding et al. |
| 2011/0241194 A1 | 10/2011 | Chen et al. |
| 2011/0278741 A1 | 11/2011 | Chua et al. |
| 2011/0309488 A1 | 12/2011 | Pagaila |
| 2012/0038053 A1 | 2/2012 | Oh et al. |
| 2012/0056321 A1 | 3/2012 | Pagaila |
| 2012/0077311 A1 | 3/2012 | Kim et al. |
| 2012/0119373 A1 | 5/2012 | Hunt |
| 2012/0153472 A1 | 6/2012 | Pagaila et al. |
| 2012/0153493 A1 | 6/2012 | Lee et al. |
| 2012/0175732 A1 | 7/2012 | Lin et al. |
| 2012/0199972 A1 | 8/2012 | Pagaila et al. |

OTHER PUBLICATIONS

Appelt et al., "Single sided substrates and packages based on laminate materials." APM-Microtech, Cambridge UK (Mar. 2010).

Appelt et al., "Single sided substrates—a new opportunity for miniaturizing packages." ICEP (Int'l Conf. on Electronics Packaging), Hokkaido, Japan (May 2010).

Appelt, et al. "A new, cost effective coreless substrate technology." Proc. ICSJ, The IEEE CPMT Symposium Japan, Univ. Tokyo, Tokyo Japan (2010).

English Translation of Abstract only for TW200924137.

(56) References Cited

OTHER PUBLICATIONS

Kikuchi, et al., "High-performance FCBGA based on ultra-thin packaging substrate," NEC J. Adv. Tech. vol. 2:3 pp. 222-228 (2005).
Non-Final Office Action dated Dec. 4, 2013 for U.S. Appl. No. 14/033,673.
Non-Final Office Action dated Apr. 24, 2013 for U.S. Appl. No. 12/904,799.
Final Office Action dated Nov. 19, 2013 for U.S. Appl. No. 12/904,799.
Non-final Office Action dated Jul. 14, 2014 for U.S. Appl. No. 14/174,364.
Final Office Action dated Feb. 6, 2015 for U.S. Appl. No. 14/174,364.
Notice of Allowance dated Jun. 30, 2015 for U.S. Appl. No. 14/174,364.
Notice of Allowance dated Apr. 29, 2014 for U.S. Appl. No. 14/033,673.
Second Notice of Allowance dated Aug. 18, 2014 for U.S. Appl. No. 14/033,673.
Non-Final Office Action dated Dec. 13, 2012 for U.S. Appl. No. 12/716,873.
Final Office Action dated Jun. 13, 2013 for U.S. Appl. No. 12/716,873.
Non-Final Office Action dated Oct. 21, 2013 for U.S. Appl. No. 12/716,873.
Non-Final Office Action dated Mar. 25, 2013 for U.S. Appl. No. 12/904,876.
Final Office Action dated Jul. 23, 2013 for U.S. Appl. No. 12/904,876.
Non-Final Office Action dated Feb. 12, 2014 for U.S. Appl. No. 12/904,876.
Final Office Action dated Jun. 17, 2014 for U.S. Appl. No. 12/904,876.
Non-Final Office Action dated Dec. 4, 2014 for U.S. Appl. No. 12/904,876.
Final Office Action dated Mar. 13, 2015 for U.S. Appl. No. 12/904,876.
Non-Final Office Action dated Sep. 11, 2015 for U.S. Appl. No. 12/904,876.
Final Office Action dated Jan. 4, 2016 for U.S. Appl. No. 12/904,876.

* cited by examiner

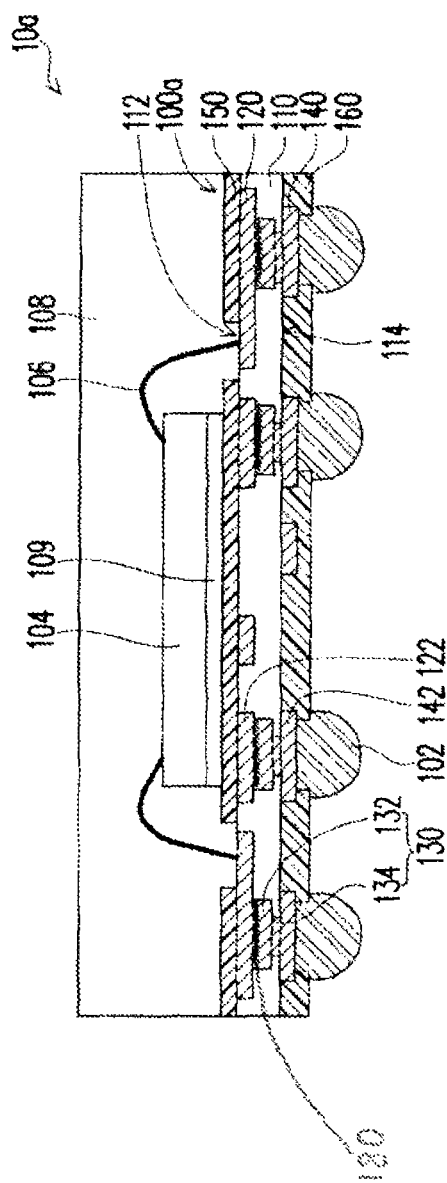
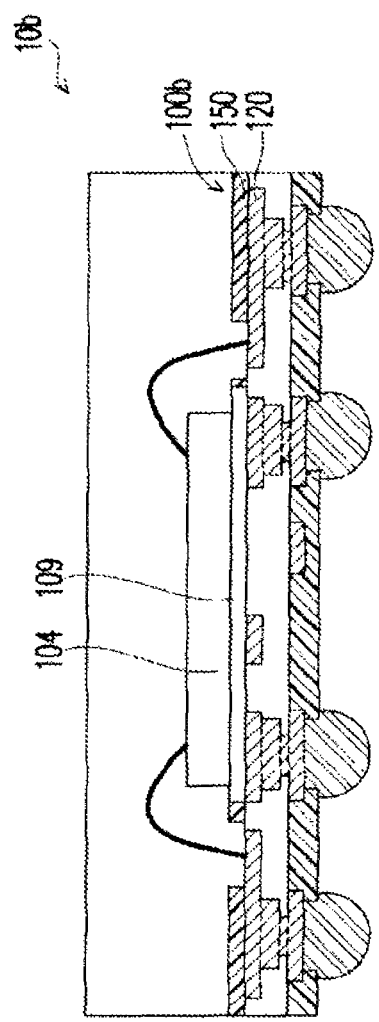
FIG. 1A
FIG. 1B

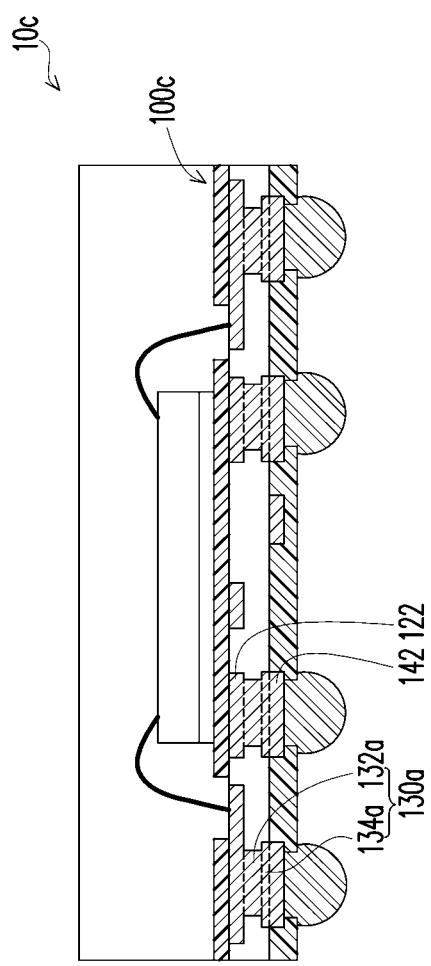
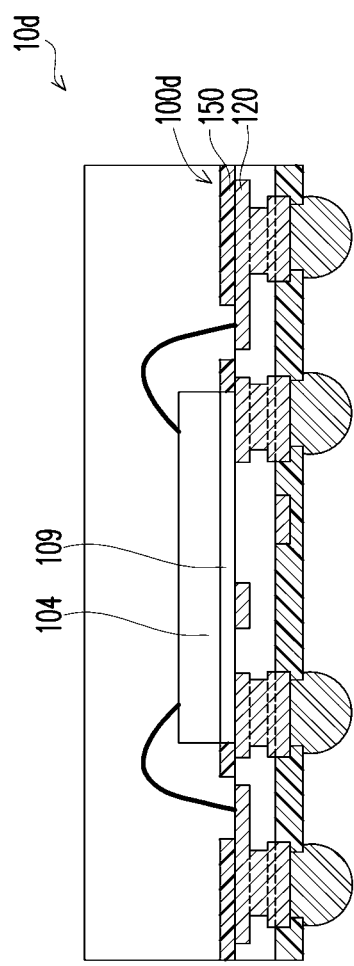
FIG. 1C
FIG. 1D

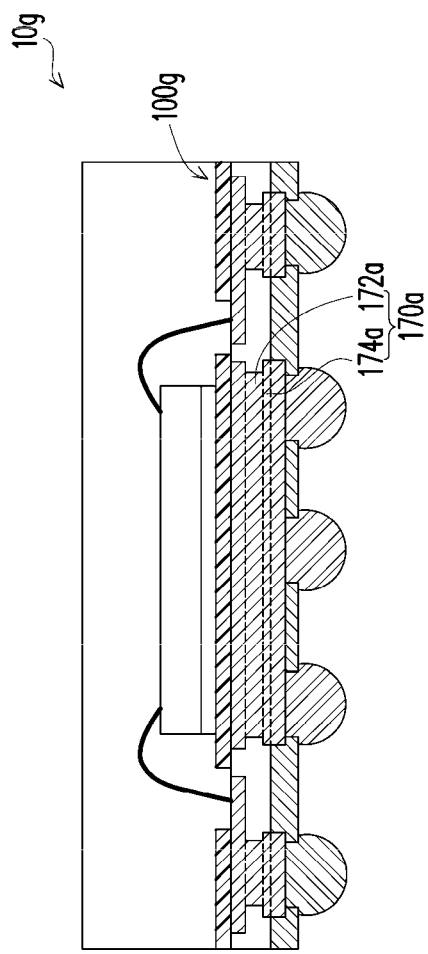
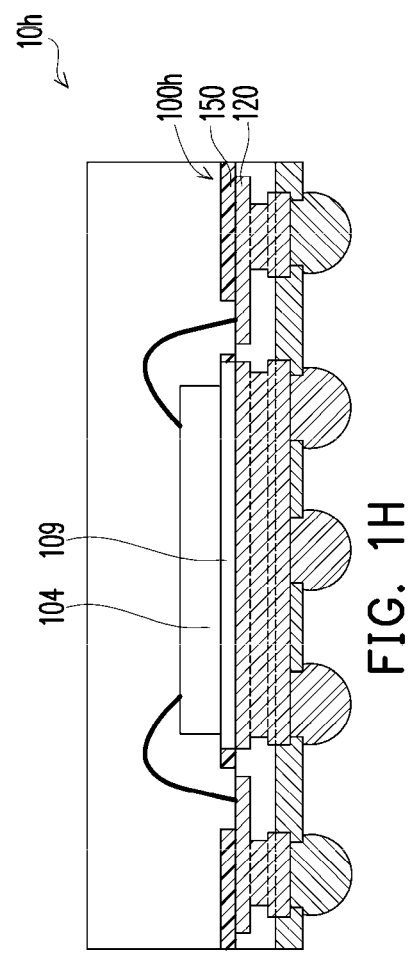

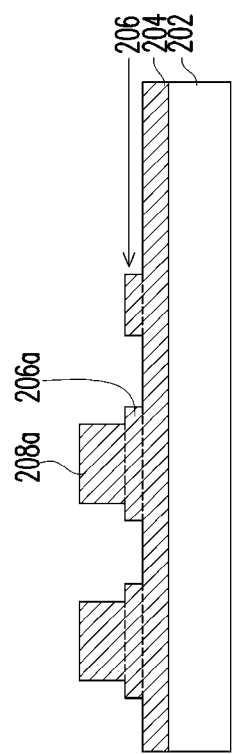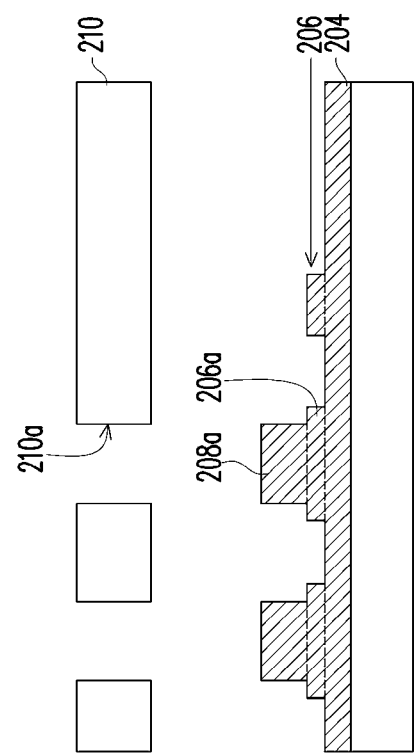
FIG. 2-1
FIG. 2-2

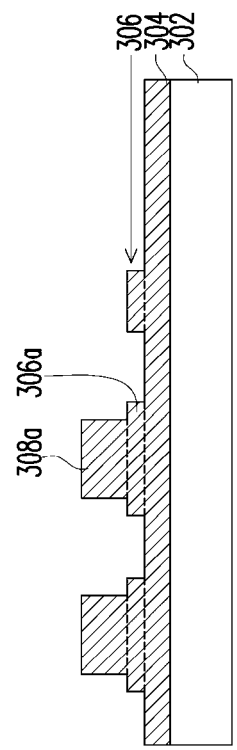
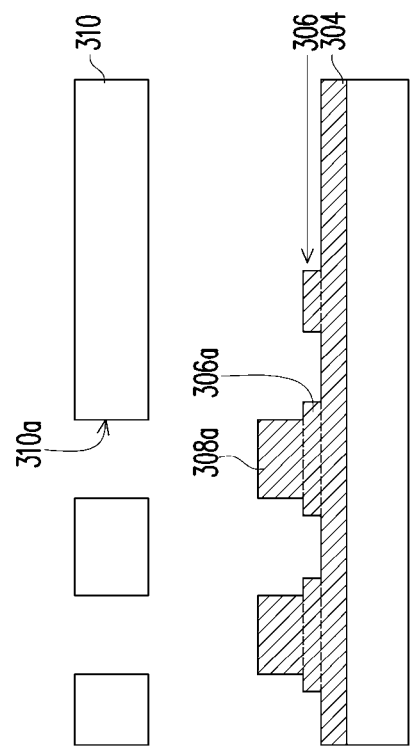
FIG. 3-1
FIG. 3-2

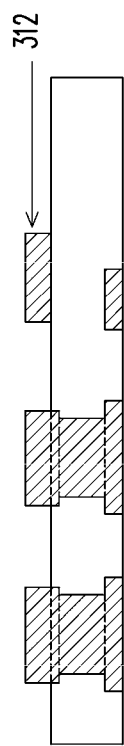
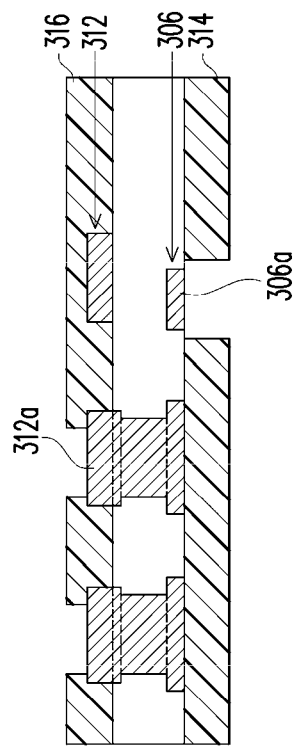
FIG. 3-9
FIG. 3-10

PACKAGE CARRIER, SEMICONDUCTOR PACKAGE, AND PROCESS FOR FABRICATING SAME

CROSS REFERENCE TO RELATED APPLICATIONS

This application is a continuation of U.S. patent application Ser. No. 12/904,876, filed Oct. 14, 2010, which claims the benefit of and priority to U.S. Provisional Application No. 61/251,396, filed on Oct. 14, 2009, U.S. Provisional Application No. 61/294,519, filed on Jan. 13, 2010, and Taiwan Application No. 99112317, filed on Apr. 20, 2010, the contents of which are incorporated herein by reference in their entirety.

FIELD OF THE INVENTION

The present invention relates to a semiconductor package. More particularly, the present invention relates to a package carrier, a package structure, and a process for fabricating a package carrier and a package structure.

BACKGROUND

A chip package serves to protect a bare chip, reduce a density of chip contacts, and provide a good heat dissipation effect for the chip. A common packaging process is to install the chip onto a package carrier, and contacts of the chip are electrically connected to the package carrier. Therefore, distribution of the contacts of the chip can be rearranged through the package carrier to cope with a contact distribution of a next stage external device.

As light weight, compactness, and high efficiency have become typical requirements of consumer electronic and communication products, chip packages should provide superior electrical properties, small overall volume, and a large number of I/O ports. Package carriers used in these chip packages often have multiple metal layers that can be electrically connected through interconnections. As the size of chip packages decreases, these interconnections can become smaller and more closely spaced, which can increase the cost and complexity of packaging processes.

It is against this background that a need arose to develop the package carriers, the package structures, and processes described herein.

SUMMARY

In an embodiment, a package carrier includes: (1) a dielectric layer having a plurality of openings; (2) a first conductive pattern, disposed adjacent to a first surface of the dielectric layer, the first conductive pattern including a plurality of first pads; and (3) a plurality of conductive vias disposed in respective ones of the openings, wherein each conductive via includes a first via segment, connected to at least one of the first pads, and a second via segment, connected to the first via segment, such that a lateral extent of the first via segment is different from a lateral extent of the second via segment.

In another embodiment, a semiconductor package includes: (1) a package carrier, including: a dielectric layer; a top conductive pattern, disposed adjacent to a top surface of the dielectric layer, and including a plurality of first pads; a bottom conductive pattern, disposed adjacent to a bottom surface of the dielectric layer, and including a plurality of second pads; a plurality of conductive vias, embedded in the dielectric layer and extending between the top conductive pattern and the bottom conductive pattern, wherein each conductive via includes a first segment, connected to at least one of the first pads, and a second segment, connected to at least one of the second pads; and (2) a chip, attached to the package carrier and connected to the first pads.

In a further embodiment, a semiconductor fabrication process includes: (1) forming a first conductive pattern including a plurality of first pads; (2) forming a plurality of first via segments on at least some of the first pads; (3) providing a dielectric layer having a plurality of first openings corresponding to the first via segments; (4) applying the dielectric layer to the first conductive pattern and the first via segments; (5) forming a plurality of second openings in the dielectric layer, such that the first via segments are exposed by the second openings; and (6) forming a plurality of second via segments on the first via segments and at least partially within the second openings, such that a diameter of the first via segment is different than a diameter of the second via segment.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

FIG. 1A through FIG. 1H are cross-sectional views of semiconductor packages according to various embodiments of the invention.

FIG. 2-1 through FIG. 2-10 illustrate a process for fabricating a package carrier according to an embodiment of the invention.

FIG. 3-1 through FIG. 3-10 illustrate a process for fabricating a package carrier according to another embodiment of the invention.

DETAILED DESCRIPTION

Figure 1E:
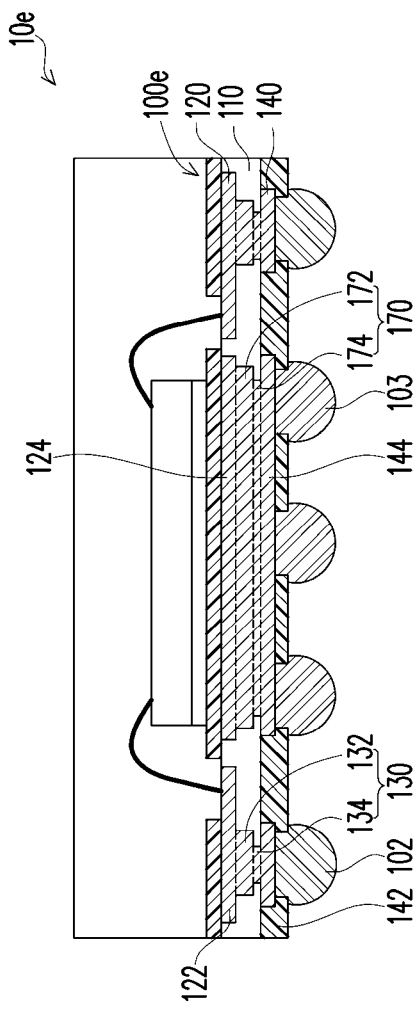

FIG. 1A is a cross-sectional view of a semiconductor package 10a according to an embodiment of the invention. Referring to FIG. 1A, the package 10a includes a package carrier 100a (or other substrate), a set of solder balls 102 (or other electrically conductive bumps), a chip 104 (or other active or passive semiconductor device), a set of bonding wires 106, and an encapsulant 108.

In particular, the package carrier 100a includes a dielectric layer 110, a first electrically conductive pattern 120, a set of first electrically conductive vias, a second electrically conductive pattern 140, a first solder mask layer 150, and a second solder mask layer 160. In the illustrated embodiment, the first conductive vias correspond to first electrically conductive posts 130, although pillars and other hollow or solid structures can be used. The dielectric layer 110 includes a first surface 112 and a second surface 114 opposite to the first surface 112. The first electrically conductive pattern 120 is embedded within the dielectric layer 110 adjacent to the first surface 112 of the dielectric layer 110, and includes a set of first pads 122. Here, the first electrically conductive pattern 120 can be regarded as an embedded circuit, and an exposed surface (e.g., a top surface) of the first electrically conductive pattern 120 is aligned (e.g., substantially aligned) with the first surface 112 of the dielectric layer 110. The dielectric layer 110 can include a resin material, such as ammonium bifluoride, ajinomoto build-up film (ABF), bismaleimide triazine (BT), polyimide (PI), liquid crystal polymer (LCP), epoxy resin, or a combination thereof. These resin materials can be mixed with glass fibers, such as in the form of a fiber pad or other types of fibers to strengthen the dielectric layer 110. The first electrically conductive pattern 120 and the second electrically conductive pattern 140 can include a metal, a metal alloy, or other electrically conductive material.

The first electrically conductive posts 130 extend through the dielectric layer 110, wherein each of the first electrically conductive posts 130 includes a first electrically conductive post segment 132 (or, more generally, a first via segment) connected to a corresponding first pad 122 and a second electrically conductive post segment 134 (or, more generally, a second via segment) connected to the first electrically conductive post segment 132. In the present embodiment, a patterned etching stop layer 180 (or other barrier layer) is located between the first electrically conductive post segments 132 and the first pads 122, wherein the first electrically conductive posts 130 can be connected to the first electrically conductive pattern 120 through the patterned etching stop layer 180 that is formed of, for example, nickel, palladium, or another electrically conductive material. Also, a diameter (or other characteristic lateral extent) of the first electrically conductive post segment 132 is greater than that of the second electrically conductive post segment 134. This difference in diameter between the first electrically conductive post segment 132 and the second electrically conductive post segment 134 results in that each of the first electrically conductive posts 130 includes a larger top or head part. Advantageously, this difference in diameter and the patterned etching stop layer 180 enhance structural rigidity and reliability of the package carrier 100a by, for example, serving as a locking mechanism for the first electrically conductive posts 130 with respect to the dielectric layer 110 and, thereby, increasing the degree of coupling for the first electrically conductive pattern 120 and the second electrically conductive pattern 140 with respect to one another and with respect to the dielectric layer 110. In addition, by forming the first electrically conductive posts 130 within the dielectric layer 110, the stress imparted by external forces, such as attributable to mechanical shock, is compensated for, and the reliability of the package 10a is improved. The first electrically conductive posts 130 can include a metal (e.g., copper), a metal alloy, or other electrically conductive material.

The second electrically conductive pattern 140 is disposed adjacent to the second surface 114 of the dielectric layer 110, and includes a set of second pads 142 that are connected to respective ones of the second electrically conductive post segments 134. The first solder mask layer 150 is disposed adjacent to the first surface 112 of the dielectric layer 110, and defines apertures or openings to expose the first pads 122. The second solder mask layer 160 is disposed adjacent to the second surface 114 of the dielectric layer 110, and defines apertures or openings to expose the second pads 142.

The first solder balls 102 are respectively disposed adjacent to the second pads 142. The chip 104 is mounted adjacent to the package carrier 100a, and is located adjacent to the first surface 112 of the dielectric layer 110. The bonding wires 106 are connected between the chip 104 and the first pads 122. The encapsulant 108 covers the chip 104, the bonding wires 106, and a part of the package carrier 100a.

In the present embodiment, the package 10a further includes an adhesion layer 109. The adhesion layer 109 is disposed between the chip 104 and the first solder mask layer 150 for adhering the chip 104 to the package carrier 100a.

FIG. 1B is a cross-sectional view of a package 10b according to another embodiment of the invention. Referring to FIG. 1A and FIG. 1B, the package 10b of FIG. 1B is similar to the package 10a of FIG. 1A, and at least one difference is that the adhesion layer 109 of the package 10b of FIG. 1B is disposed between the chip 104 and the first electrically conductive pattern 120, which is exposed by the first solder mask layer 150 of a package carrier 100b.

FIG. 1C is a cross-sectional view of a package 10c according to another embodiment of the invention. Referring to FIG. 1A and FIG. 1C, the package 10c of FIG. 1C is similar to the package 10a of FIG. 1A, and at least one difference is that, in a package carrier 100c of FIG. 1C, the diameter of the first electrically conductive post segment 132a is smaller than the diameter of the second electrically conductive post segment 134a.

FIG. 1D is a cross-sectional view of a package 10d according to another embodiment of the invention. Referring to FIG. 1C and FIG. 1D, the package 10d of FIG. 1D is similar to the package 10c of FIG. 1C, and at least one difference is that the adhesion layer 109 of the package 10d of FIG. 1D is disposed between the chip 104 and the first electrically conductive pattern 120, which is exposed by the first solder mask layer 150 of a package carrier 100d.

FIG. 1E is a cross-sectional view of a package 10e according to another embodiment of the invention. Referring to FIG. 1A and FIG. 1E, the package 10e of FIG. 1E is similar to the package 10a of FIG. 1A, and at least one difference is that a package carrier 100e of the package 10e of FIG. 1E further includes a chip pad support 170, which can include a metal (e.g., copper), a metal alloy, or other electrically conductive material. The chip pad support 170 extends through the dielectric layer 110, wherein the first electrically conductive pattern 120 includes a third pad 124 serving as a chip pad, and the chip 104 is mounted adjacent to the third pad 124. The chip pad support 170 includes a first support segment 172 connected to the third pad 124, and a second support segment 174 connected to the first support segment 172. The second electrically conductive pattern 140 includes a fourth pad 144 connected to the second support segment 174. The chip 104 can be connected to the third pad 124, such as by wire-bonding, and the third pad 124 and the chip pad support 170 can provide an electrically pathway between the chip 104 and the fourth pad 144.

In the present embodiment, a diameter of the first support segment 172 is greater than that of the second support segment 174. Moreover, the diameter of the first support segment 172 is greater than that of the first electrically conductive post segment 132, and the diameter of the second support segment 174 is greater than that of the second electrically conductive post segment 134. Moreover, the package 10e of FIG. 1E further includes a set of second solder balls 103 (or other electrically conductive bumps) respectively disposed adjacent to the fourth pad 144.

Figure 1F:
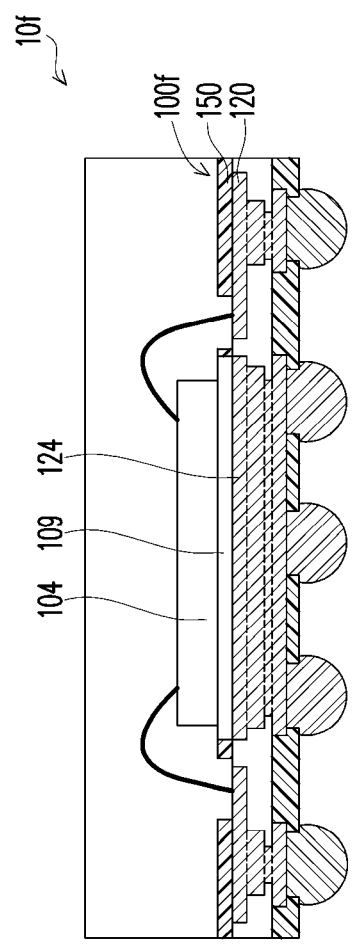

FIG. 1F is a cross-sectional view of a package 10f according to another embodiment of the invention. Referring to FIG. 1E and FIG. 1F, the package 10f of FIG. 1F is similar to the package 10e of FIG. 1E, and at least one difference is that the adhesion layer 109 of the package 10f of FIG. 1F is disposed between the chip 104 and the first electrically conductive pattern 120, which is exposed by the first solder mask layer 150 of a package carrier 100f. In the present embodiment, the adhesion layer 109 is directly connected to the third pad 124 of the first electrically conductive pattern 120.

FIG. 1G is a cross-sectional view of a package 10g according to another embodiment of the invention. Referring to FIG. 1E and FIG. 1G, the package 10g of FIG. 1G is similar to the package 10e of FIG. 1E, and at least one difference is that, in a package carrier 100g of FIG. 1G, the diameter of the first support segment 172a is smaller than that of the second support segment 174a.

FIG. 1H is a cross-sectional view of a package 10h according to another embodiment of the invention. Referring to FIG. 1G and FIG. 1H, the package 10h of FIG. 1H is similar to the package 10g of FIG. 1G, and at least one difference is that the adhesion layer 109 of the package 10h of FIG. 1H is disposed between the chip 104 and the first electrically conductive pattern 120, which is exposed by the first solder mask layer 150 of a package carrier 100h. In the present embodiment, the adhesion layer 109 is directly connected to the third pad 124 of the first electrically conductive pattern 120.

In some embodiments, a surface finishing or passivation layer (not shown) can be disposed adjacent to an exposed surface of an electrically conductive pattern, which layer can include nickel/gold, nickel/cadmium/gold, nickel/silver, gold, tin, alloys thereof (e.g., a tin-lead alloy), silver, electroless nickel electroless palladium immersion gold (EN-EPIG), or a combination thereof.

Although the chip 104 in the aforementioned embodiments is electrically connected to the first electrically conductive pattern 120 through a wire-bonding technique, the chip 104 can also be electrically connected to the first electrically conductive pattern 120 through a flip-chip bonding technique, such as by having an exposed surface of the first electrically conductive pattern 120 located below the chip 104. In particular, the chip 104 can be connected to the exposed surface of the first electrically conductive pattern 120 through conductive bumps, such as solder bumps, copper pillars, copper stud bumps, or golden stud bumps. Moreover, an underfill material can be disposed between the chip 104 and a package carrier for encapsulating or wrapping the conductive bumps.

Figures 2, 3:
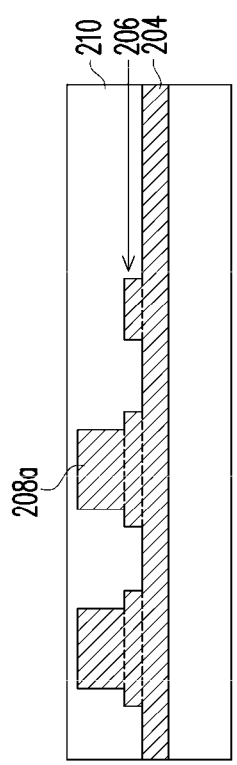

Attention next turns to FIG. 2-1 to FIG. 2-10, which illustrate a process for fabricating a package carrier according to an embodiment of the invention. Referring to FIG. 2-1, a carrier 202, an initial electrically conductive layer 204, a first electrically conductive pattern 206, and a set of first electrically conductive post segments 208a are provided, wherein the initial electrically conductive layer 204 is disposed adjacent to the carrier 202, the first electrically conductive pattern 206 is disposed adjacent to the initial electrically conductive layer 204 and includes a set of first pads 206a, and the first electrically conductive post segments 208a are respectively disposed adjacent to the first pads 206a. As discussed above, a patterned etching stop layer (or other barrier layer) can be located between the first electrically conductive post segments 208a and the first pads 206a. In the present embodiment, a semi-additive process can be used to sequentially form the first electrically conductive pattern 206 and the first electrically conductive post segments 208a adjacent to the initial electrically conductive layer 204.

In particular, a temporary mask of a dielectric material, a photoresist, or other suitable material is disposed adjacent to the initial electrically conductive layer 204, and then the mask is patterned to form openings at corresponding positions of the first electrically conductive pattern 206. The initial electrically conductive layer 204 is used as a plating layer, which provides a current pathway to form the first electrically conductive pattern 206 in the openings through electroplating. Then, the mask used for the electroplating is removed.

Then, a temporary mask of a dielectric material, a photoresist, or other suitable material is disposed adjacent to the first electrically conductive pattern 206 and the initial electrically conductive layer 204. Then, the mask is patterned to form openings at corresponding positions of the first electrically conductive post segments 208a. The first electrically conductive pattern 206 and the initial electrically conductive layer 204 are used as plating layers, which provide a current pathway to form the first electrically conductive post segments 208a in the openings through electroplating. Then, the mask used for the electroplating is removed.

Next, referring to FIG. 2-2, a dielectric layer 210 is provided, wherein the dielectric layer 210 is pre-formed with a set of first openings 210a, and positions of the first openings 210a respectively correspond to positions of the first electrically conductive post segments 208a. In the present embodiment, the dielectric layer 210 can be a fiber-reinforced resin material, such as a prepreg material. While the openings 210a are shown in FIG. 2-2 as fully extending through the dielectric layer 210, it is contemplated that the openings 210a also can partially extend through the dielectric layer 210.

Then, referring to FIG. 2-3, the dielectric layer 210 is laminated to the initial electrically conductive layer 204, so that the first electrically conductive pattern 206 and the first electrically conductive post segments 208a are embedded in the dielectric layer 210. In the case where the openings 210a (shown in FIG. 2-2) fully extend through the dielectric layer 210, a thermal lamination process can be used, which can result in some dielectric material being displaced so as to cover top ends of the first electrically conductive post segments 208a as shown in FIG. 2-3. It is also contemplated that the dielectric layer 210 can be formed in situ adjacent to the initial electrically conductive layer 204.

Figures 2, 3, 4:
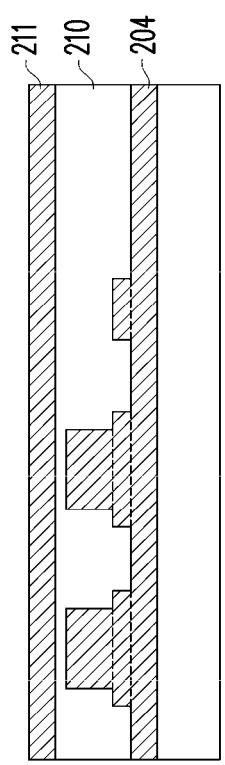

Then, referring to FIG. 2-4, an electrically conductive layer 211 (e.g., a metal film or foil) is laminated to the dielectric layer 210, so that the dielectric layer 210 is laminated between the electrically conductive layer 211 and the initial electrically conductive layer 204. In some embodiments, the dielectric layer 210 and the electrically conductive layer 211 can be simultaneously laminated to the initial electrically conductive layer 204 in a common process operation.

Next, referring to FIG. 2-5, a set of conformal openings 211a are formed in the electrically conductive layer 211. The conformal openings 211a respectively expose parts of the dielectric layer 210 at positions corresponding to the first electrically conductive post segments 208a. In the present embodiment, a diameter of each of the conformal openings 211a is smaller than a diameter of the corresponding first electrically conductive post segment 208a.

Then, referring to FIG. 2-6, the parts of the dielectric layer 210 exposed by the conformal openings 211a are removed to form a set of second openings 210b in the dielectric layer 210, so that the first electrically conductive post segments 208a are respectively exposed by the second openings 210b. In the present embodiment, the electrically conductive layer 211 can be used as a conformal mask to selectively remove the parts of the dielectric layer 210 exposed by the conformal openings 211a through plasma etching, so as to form the second openings 210b. Alternatively, or in conjunction, the parts of the dielectric layer 210 exposed by the conformal openings 211a can be removed by laser drilling or another material removal technique. In the present embodiment, a diameter of each of the second openings 210b is smaller than the diameter of the corresponding first electrically conductive post segment 208a.

Next, referring to FIG. 2-6 and FIG. 2-7, the electrically conductive layer 211 is removed to expose the dielectric layer 210.

Then, referring to FIG. 2-8, a second electrically conductive post segment 208b is formed in each of the second openings 210b, wherein each second electrically conductive post segment 208b and the corresponding first electrically conductive post segment 208a are connected together to form an electrically conductive post 208. In the present embodiment, the second electrically conductive post segments 208b can be formed through electroplating. It should be noted that, since the diameter of the second opening 210b is smaller than the diameter of the first electrically conductive post segment 208a, the diameter of the second electrically conductive post segment 208b is smaller than that of the first electrically conductive post segment 208a.

Then, still referring to FIG. 2-8, a second electrically conductive pattern 212 is formed adjacent to the second electrically conductive post segments 208b and the dielectric layer 210, wherein the second electrically conductive pattern 212 includes a set of second pads 212a, and the second pads 212a are respectively connected to the second electrically conductive post segments 208b. In the present embodiment, a non-patterned electrically conductive layer (not shown) is first formed adjacent to the dielectric layer 210 and the second electrically conductive post segments 208b through electroplating, and then the non-patterned electrically conductive layer is patterned to form the second electrically conductive pattern 212. During electroplating to form the non-patterned electrically conductive layer, the second electrically conductive post segments 208b can also be formed in a common process operation.

Next, referring to FIG. 2-8 and FIG. 2-9, the carrier 202 and the initial electrically conductive layer 204 are removed. In the present embodiment, the carrier 202 and the initial electrically conductive layer 204 can have a release interface in between, so that the carrier 202 can be released from the initial electrically conductive layer 204. Moreover, the initial electrically conductive layer 204 can be removed by etching, and exposed surfaces (e.g., of the second electrically conductive pattern 212) can be protected from etching while the initial electrically conductive layer 204 is removed.

Next, referring to FIG. 2-10, a first solder mask layer 214 is formed adjacent to the first electrically conductive pattern 206, wherein the first solder mask layer 214 exposes the first pads 206a. Moreover, a second solder mask layer 216 is formed adjacent to the second electrically conductive pattern 212, wherein the second solder mask layer 216 exposes the second pads 212a. In some embodiments, a surface finishing or passivation layer (not shown) can be formed adjacent to either, or both, of the first pads 206a and the second pads 212a. The surface passivation layer can include, for example, nickel/gold, nickel/cadmium/gold, nickel/silver, gold, tin, alloys thereof (e.g., a tin-lead alloy), silver, electroless nickel electroless palladium immersion gold (EN-EPIG), or a combination thereof.

Once a package carrier is fabricated in accordance with FIG. 2-1 through FIG. 2-10, a package according to an embodiment of the invention can be fabricated by disposing a chip (e.g., the chip 104 in FIG. 1A) adjacent to the package carrier, electrically connecting the chip to the first pads 206a, and disposing solder balls (e.g., the first solder balls 102 of FIG. 1A) adjacent to respective ones of the second pads 212a.

FIG. 3-1 to FIG. 3-10 illustrate a process for fabricating a package carrier according to another embodiment of the invention. Referring to FIG. 3-1, a carrier 302, an initial electrically conductive layer 304, a first electrically conductive pattern 306, and a set of first electrically conductive post segments 308a are provided, wherein the initial electrically conductive layer 304 is disposed adjacent to the carrier 302, the first electrically conductive pattern 306 is disposed adjacent to the initial electrically conductive layer 304 and includes a set of first pads 306a, and the first electrically conductive post segments 308a are respectively disposed adjacent to the first pads 306a. In the present embodiment, a semi-additive process can be used to sequentially form the first electrically conductive pattern 306 and the first electrically conductive post segments 308a adjacent to the initial electrically conductive layer 304.

In particular, a temporary mask of a dielectric material, a photoresist, or other suitable material is disposed adjacent to the initial electrically conductive layer 304, and then the mask is patterned to form openings at corresponding positions of the first electrically conductive pattern 306. The initial electrically conductive layer 304 is used as a plating layer, which provides a current pathway to form the first electrically conductive pattern 306 in the openings through electroplating. Then, the mask used for the electroplating is removed.

Then, a temporary mask of a dielectric material, a photoresist, or other suitable material is disposed adjacent to the first electrically conductive pattern 306 and the initial electrically conductive layer 304. Then, the mask is patterned to form openings at corresponding positions of the first electrically conductive post segments 308a. The first electrically conductive pattern 306 and the initial electrically conductive layer 304 are used as plating layers, which provide a current pathway to form the first electrically conductive post segments 308a in the openings through electroplating. Then, the mask used for the electroplating is removed.

Next, referring to FIG. 3-2, a dielectric layer 310 is provided, wherein the dielectric layer 310 is pre-formed with a set of first openings 310a, and positions of the first openings 310a respectively correspond to positions of the first electrically conductive post segments 308a. In the present embodiment, the dielectric layer 310 can be a fiber-reinforced resin material, such as a prepreg material. While the openings 310a are shown in FIG. 3-2 as fully extending through the dielectric layer 310, it is contemplated that the openings 310a also can partially extend through the dielectric layer 310.

Then, referring to FIG. 3-3, the dielectric layer 310 is laminated to the initial electrically conductive layer 304, so that the first electrically conductive pattern 306 and the first electrically conductive post segments 308a are embedded in the dielectric layer 310. In the case where the openings 310a (shown in FIG. 3-2) fully extend through the dielectric layer 310, a thermal lamination process can be used, which can result in some dielectric material being displaced so as to cover top ends of the first electrically conductive post segments 308a as shown in FIG. 3-3. It is also contemplated that the dielectric layer 310 can be formed in situ adjacent to the initial electrically conductive layer 304.

Then, referring to FIG. 3-4, an electrically conductive layer 311 (e.g., a metal film or foil) is laminated to the dielectric layer 310, so that the dielectric layer 310 is laminated between the electrically conductive layer 311 and the initial electrically conductive layer 304. In some embodiments, the dielectric layer 310 and the electrically conductive layer 311 can be simultaneously laminated to the initial electrically conductive layer 304 in a common process operation.

Figures 2, 3, 4, 5:
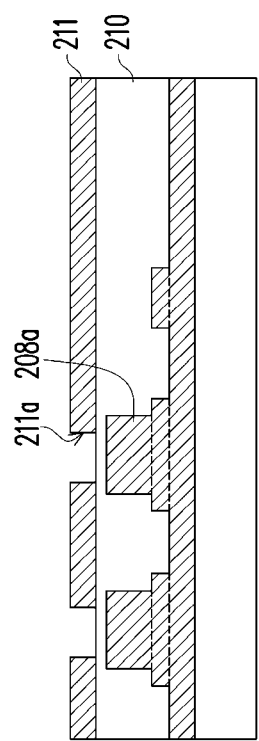
Figures 2, 3, 4, 5, 6:
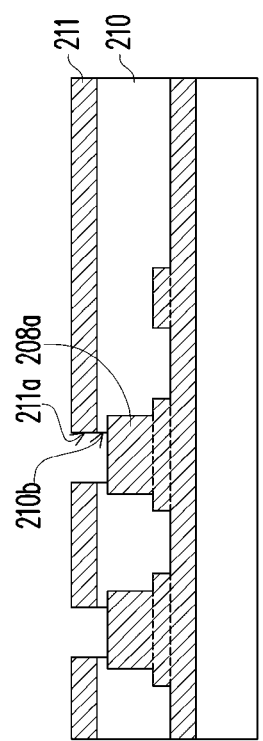
Figures 2, 3, 4, 5, 6, 7:
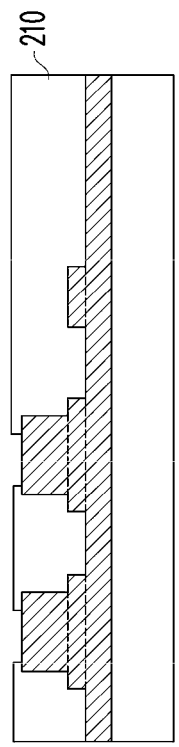
Figures 2, 3, 4, 5, 6, 7, 8:
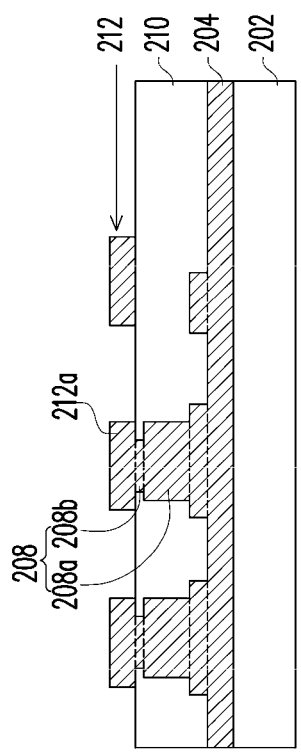
Figures 2, 3, 4, 5, 6, 7, 8, 9:
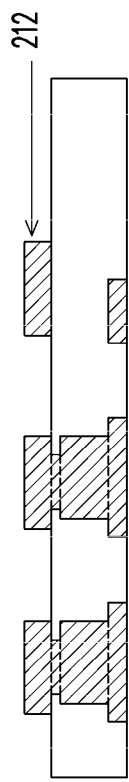
Figures 2, 3, 4, 5, 6, 7, 8, 9, 10:
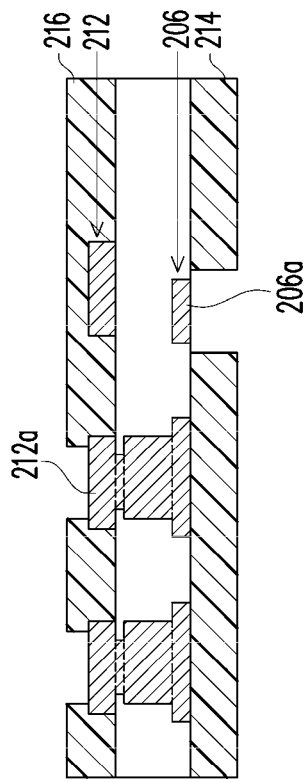
Figure 3:
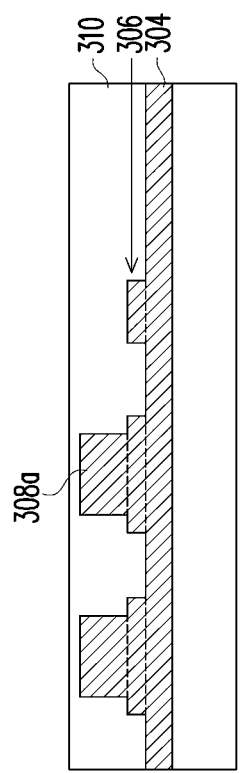
Figures 3, 4:
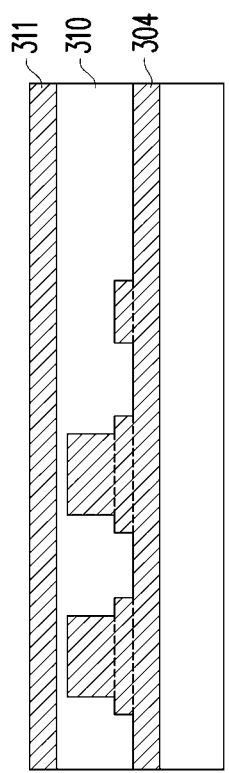
Figures 3, 4, 5:
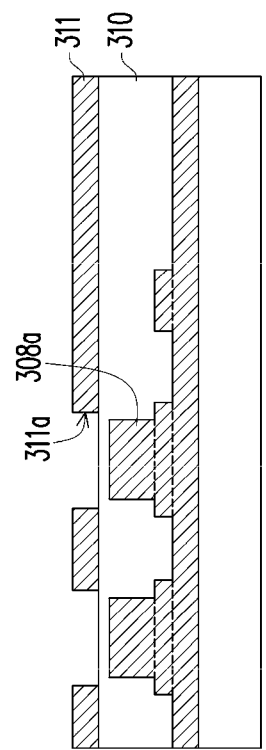
Figures 3, 4, 5, 6:
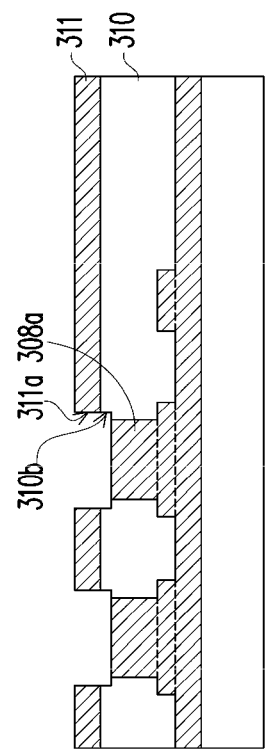
Figures 3, 4, 5, 6, 7:
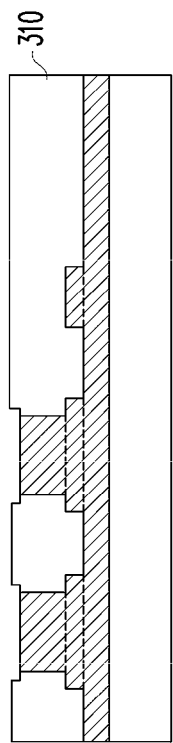
Figures 3, 4, 5, 6, 7, 8:
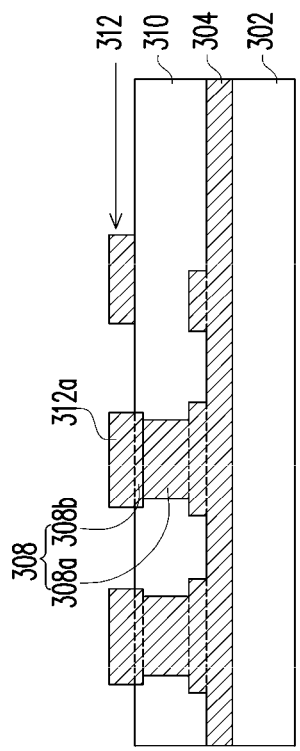

Next, referring to FIG. 3-5, a set of conformal openings 311a are formed in the electrically conductive layer 311. The conformal openings 311a respectively expose parts of the dielectric layer 310 at positions corresponding to the first electrically conductive post segments 308a. In the present embodiment, a diameter of each of the conformal openings 311a is greater than a diameter of the corresponding first electrically conductive post segment 308a.

Then, referring to FIG. 3-6, the parts of the dielectric layer 310 exposed by the conformal openings 311a are removed to form a set of second openings 310b in the dielectric layer 310, so that the first electrically conductive post segments 308a are respectively exposed by the second openings 310b. In the present embodiment, the electrically conductive layer 311 can be used as a conformal mask to selectively remove the parts of the dielectric layer 310 exposed by the conformal openings 311a through plasma etching, so as to form the second openings 310b. Alternatively, or in conjunction, the parts of the dielectric layer 310 exposed by the conformal openings 311a can be removed by laser drilling or another material removal technique. In the present embodiment, a diameter of each of the second openings 310b is greater than the diameter of the corresponding first electrically conductive post segment 308a.

Next, referring to FIG. 3-6 and FIG. 3-7, the electrically conductive layer 311 is removed to expose the dielectric layer 310.

Then, referring to FIG. 3-8, a second electrically conductive post segment 308b is formed in each of the second openings 310b, wherein each second electrically conductive post segment 308b and the corresponding first electrically conductive post segment 308a are connected together to form an electrically conductive post 308. In the present embodiment, the second electrically conductive post segments 308b can be formed through electroplating. It should be noted that, since the diameter of the second opening 310b is greater than the diameter of the first electrically conductive post segment 308a, the diameter of the second electrically conductive post segment 308b is greater than that of the first electrically conductive post segment 308a.

Then, still referring to FIG. 3-8, a second electrically conductive pattern 312 is formed adjacent to the second electrically conductive post segments 308b and the dielectric layer 310, wherein the second electrically conductive pattern 312 includes a set of second pads 312a, and the second pads 312a are respectively connected to the second electrically conductive post segments 308b. In the present embodiment, a non-patterned electrically conductive layer (not shown) is first formed adjacent to the dielectric layer 310 and the second electrically conductive post segments 308b through electroplating, and then the non-patterned electrically conductive layer is patterned to form the second electrically conductive pattern 312. During electroplating to form the non-patterned electrically conductive layer, the second electrically conductive post segments 308b can also be formed in a common process operation.

Next, referring to FIG. 3-8 and FIG. 3-9, the carrier 302 and the initial electrically conductive layer 304 are removed.

In the present embodiment, the carrier 302 and the initial electrically conductive layer 304 can have a release interface in between, so that the carrier 302 can be released from the initial electrically conductive layer 304. Moreover, the initial electrically conductive layer 304 can be removed by etching, and exposed surfaces (e.g., of the second electrically conductive pattern 312) can be protected from etching while the initial electrically conductive layer 304 is removed.

Next, referring to FIG. 3-10, a first solder mask layer 314 is formed adjacent to the first electrically conductive pattern 306, wherein the first solder mask layer 314 exposes the first pads 306a. Moreover, a second solder mask layer 316 is formed adjacent to the second electrically conductive pattern 312, wherein the second solder mask layer 316 exposes the second pads 312a. In some embodiments, a surface finishing or passivation layer (not shown) can be formed adjacent to either, or both, of the first pads 306a and the second pads 312a. The surface passivation layer can include, for example, nickel/gold, nickel/cadmium/gold, nickel/silver, gold, tin, alloys thereof (e.g., a tin-lead alloy), silver, electroless nickel electroless palladium immersion gold (EN-EPIG), or a combination thereof.

Once a package carrier is fabricated in accordance with FIG. 3-1 through FIG. 3-10, a package according to an embodiment of the invention can be fabricated by disposing a chip (e.g., the chip 104 in FIG. 1C) adjacent to the package carrier, electrically connecting the chip to the first pads 306a, and disposing solder balls (e.g., the first solder balls 102 of FIG. 1C) adjacent to respective ones of the second pads 312a.

It should be recognized that similar operations as discussed for FIG. 2-1 through FIG. 2-10 and FIG. 3-1 through FIG. 3-10 can be used to fabricate a package carrier and a package including a chip pad and a chip support pad that is connected to the chip pad (e.g., as illustrated in FIG. 1E through FIG. 1H).

In summary, in a package carrier of some embodiments of the invention, electrically conductive posts can be used so as to effectively reduce a package size and a package area, while controlling the cost and complexity of packaging processes.

While the invention has been described with reference to the specific embodiments thereof, it should be understood by those skilled in the art that various changes may be made and equivalents may be substituted without departing from the true spirit and scope of the invention. In addition, modifications may be made to adapt a particular situation, material, composition of matter, method, or process, within the scope of the claims, including variances or tolerances attributable to manufacturing processes and techniques. In particular, while the methods disclosed herein have been described with reference to particular operations performed in a particular order, it will be understood that these operations may be combined, sub-divided, or re-ordered to form an equivalent method and resultant structure consistent with the teachings of the invention.

What is claimed is:

1. A semiconductor fabrication process, comprising:
   (a) forming a first conductive pattern adjacent to a carrier;
   (b) forming a plurality of first conductive post segments on the first conductive pattern; and
   (c) applying a dielectric layer to the first conductive pattern and exposing the first conductive post segments, wherein (c) includes:

(c1) applying a dielectric layer to cover the first conductive pattern and the first conductive post segments;
(c2) forming a plurality of openings in the dielectric layer, such that the first conductive post segments are exposed by the openings; and
(c3) forming a plurality of second conductive post segments on the first conductive post segments and at least partially within the openings;
wherein a diameter of each opening is smaller than a diameter of the corresponding first conductive post segment such that the diameter of each second conductive post segment is smaller than the diameter of the corresponding first conductive post segment.

2. The process as claimed in claim 1, wherein in (a), the carrier includes a first conductive layer, and the first conductive pattern is formed on the first conductive layer.

3. The process as claimed in claim 2, wherein the first conductive pattern is formed by a semi-additive process, and the first conductive layer provides a current pathway for electroplating.

4. The process as claimed in claim 2, wherein the first conductive post segments are formed by a semi-additive process, and the first conductive layer and the first conductive pattern provide a current pathway for electroplating.

5. The process as claimed in claim 2, further comprising:
(d) removing the carrier and the first conductive layer to expose the dielectric layer and the first conductive pattern.

6. The process as claimed in claim 1, wherein in (c), the first conductive pattern is substantially aligned with a first surface of the dielectric layer.

7. The process as claimed in claim 1, further comprising:
(d) forming a second conductive pattern on the dielectric layer to electrically connect to the first conductive pattern through the openings.

8. The process as claimed in claim 1, wherein the dielectric layer comprises one or more materials from a group consisting of: a prepreg material, ammonium bifluoride, ajinomoto build-up film (ABF), bismaleimide triazine (BT), polyimide (PI), liquid crystal polymer (LCP), and epoxy resin.

9. A semiconductor device fabrication process, comprising:
(a) forming a first conductive pattern adjacent to a carrier;
(b) forming a plurality of first conductive post segments on the first conductive pattern;
(c) applying a dielectric layer to the first conductive pattern and exposing the first conductive post segments, wherein (c) includes:
(c1) applying a dielectric layer to cover the first conductive pattern and the first conductive post segments;
(c2) forming a plurality of openings in the dielectric layer, such that the first conductive post segments are exposed by the openings; and
(c3) forming a plurality of second conductive post segments on the first conductive post segments and at least partially within the openings;
wherein a diameter of each opening is smaller than a diameter of the corresponding first conductive post segment such that the diameter of each second conductive post segment is smaller than the diameter of the corresponding first conductive post segment;
(d) disposing a chip on the dielectric layer; and
(e) electrically connecting the chip to the first conductive pattern.

10. The process as claimed in claim 9, wherein in (a), the carrier includes a first conductive layer, and the first conductive pattern is formed on the first conductive layer.

11. The process as claimed in claim 10, further comprising:
(d) removing the carrier and the first conductive layer to expose the dielectric layer and the first conductive pattern.

12. The process as claimed in claim 9, wherein in (c), the first conductive pattern is substantially aligned with a first surface of the dielectric layer.

13. The process as claimed in claim 9, wherein the dielectric layer comprises one or more materials from a group consisting of: a prepreg material, ammonium bifluoride, ajinomoto build-up film (ABF), bismaleimide triazine (BT), polyimide (PI), liquid crystal polymer (LCP), and epoxy resin.

14. A semiconductor device fabrication process, comprising:
(a) forming a first conductive pattern adjacent to a carrier;
(b) forming a plurality of first conductive post segments on the first conductive pattern;
(c) applying a dielectric layer to cover the first conductive pattern and the first conductive post segments;
(d) forming a plurality of openings in the dielectric layer, such that the first conductive post segments are exposed by the openings, wherein a diameter of each opening is different from a diameter of the corresponding first conductive post segment;
(e) forming a plurality of second conductive post segments on the first conductive post segments and within the openings such that a diameter of each second conductive post segment is different from the diameter of the corresponding first conductive post segment;
(f) disposing a chip on the dielectric layer; and
(g) electrically connecting the chip to the first conductive pattern.

15. The process as claimed in claim 14, wherein in (a), the carrier includes a first conductive layer, and the first conductive pattern is formed on the first conductive layer.

16. The process as claimed in claim 15, wherein the first conductive pattern is formed by a semi-additive process, and the first conductive layer provides a current pathway for electroplating.

17. The process as claimed in claim 15, wherein after (d), the process further comprises:
(d1) removing the carrier and the first conductive layer to expose the dielectric layer and the first conductive pattern.

18. The process as claimed in claim 14, wherein the dielectric layer comprises one or more materials from a group consisting of: a prepreg material, ammonium bifluoride, ajinomoto build-up film (ABF), bismaleimide triazine (BT), polyimide (PI), liquid crystal polymer (LCP), and epoxy resin.

19. The process as claimed in claim 14, wherein after (e), the process further comprises:
(e1) forming a second conductive pattern on the dielectric layer to electrically connect to the first conductive pattern through the openings.

20. The process as claimed in claim 14, wherein the diameter of each opening is smaller than the diameter of the corresponding first conductive post segment.

* * * * *